United States Patent
Yokoyama

(10) Patent No.: US 8,444,256 B2
(45) Date of Patent: May 21, 2013

(54) PIEZOELECTRIC ACTUATOR AND LIQUID EJECTING HEAD

(75) Inventor: Naoto Yokoyama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 238 days.

(21) Appl. No.: 12/840,393

(22) Filed: Jul. 21, 2010

(65) Prior Publication Data

US 2011/0018944 A1   Jan. 27, 2011

(30) Foreign Application Priority Data

Jul. 23, 2009   (JP) .................................. 2009-171891

(51) Int. Cl.
*B41J 2/045* (2006.01)

(52) U.S. Cl.
USPC .................... 347/68; 347/50; 347/71; 347/72

(58) Field of Classification Search .................... 347/50, 347/68–72
See application file for complete search history.

(56) References Cited

U.S. PATENT DOCUMENTS

2005/0088490 A1*   4/2005   Mita ............................... 347/68

FOREIGN PATENT DOCUMENTS

| JP | 11-112048 | 4/1999 |
| JP | 2009-018551 | 1/2009 |

* cited by examiner

*Primary Examiner* — Matthew Luu
*Assistant Examiner* — Henok Legesse
(74) *Attorney, Agent, or Firm* — Workman Nydegger

(57) ABSTRACT

There is provided a piezoelectric actuator including: a substrate that is supported by a support portion; a piezoelectric element that includes a lower electrode formed on the substrate, a piezoelectric layer formed on the lower substrate, and an upper electrode formed on the piezoelectric layer; and a driving circuit that applies a voltage to the piezoelectric element. The upper electrode has a first upper electrode that is positioned on an outer peripheral side of the piezoelectric layer and at least one second upper electrode that is positioned on a center side of the piezoelectric layer, and a voltage applied to the first upper electrode is lower than a voltage applied to the second upper electrode.

6 Claims, 7 Drawing Sheets

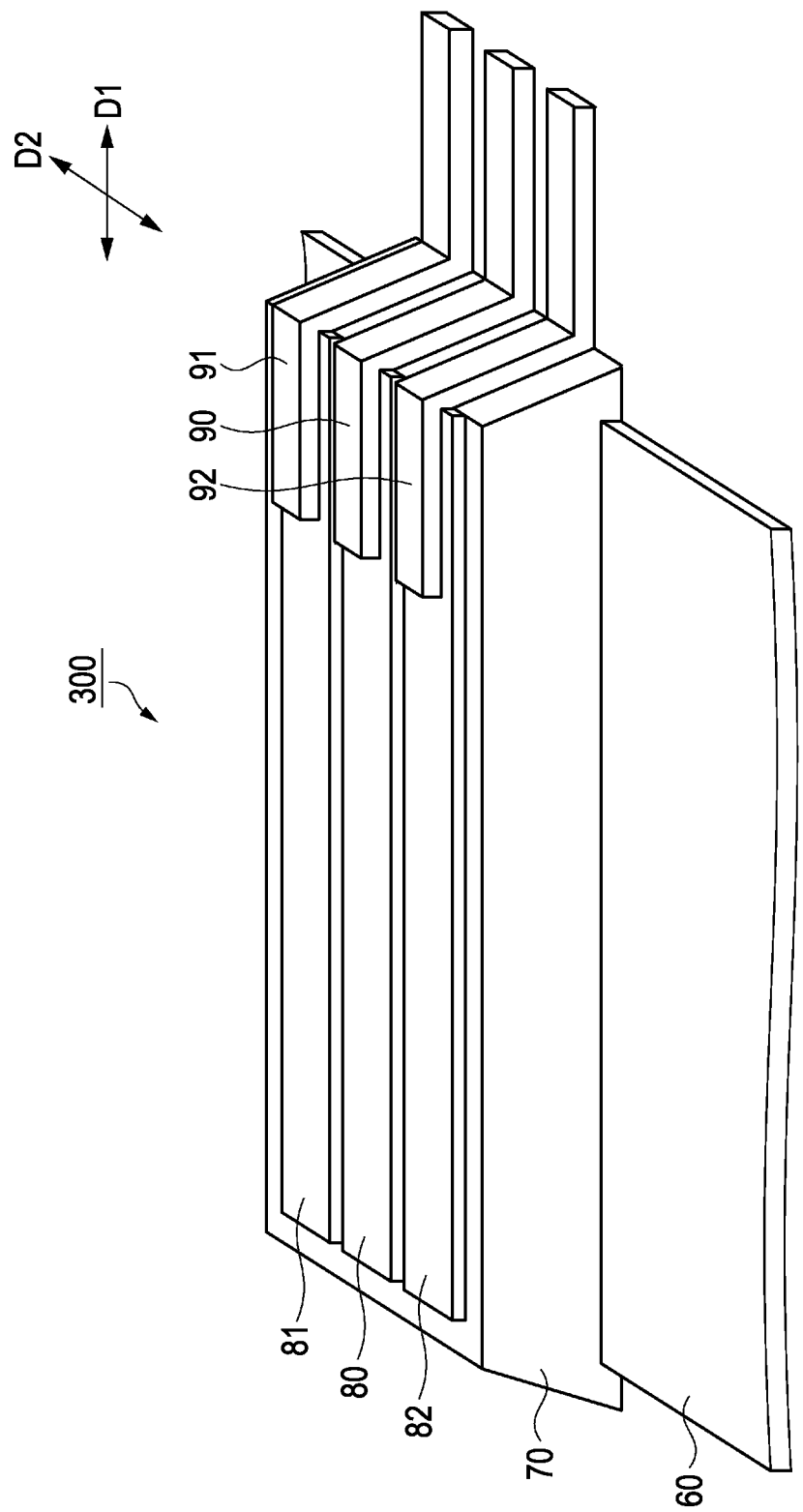

PIEZOELECTRIC ACTUATOR AND LIQUID EJECTING HEAD

This application claims a priority to Japanese Patent Application No. 2009-171891 filed on Jul. 23, 2009 which is hereby expressly incorporated by reference herein in its entirety.

BACKGROUND

1. Technical Field

The present invention relates to a piezoelectric actuator and a liquid ejecting head.

2. Related Art

Piezoelectric actuators that are configured by piezoelectric elements are used as liquid ejecting units of piezo-type liquid ejecting heads that are mounted in liquid ejecting apparatuses. The piezoelectric element configuring the piezoelectric actuator is disposed on a substrate that configures a pressure generating chamber. The piezo-type liquid ejecting head transforms the substrate in accordance with a change in the volume of the piezoelectric element and applies pressure to the liquid inside the pressure generating chamber, whereby it ejects the liquid.

There are cases where cracks are generated in the piezoelectric element during driving of the above-described liquid ejecting head. Thus, in JP-A-11-112048, a configuration of a piezoelectric element that suppresses generation of cracks by alleviating the remaining stress generated at the time of manufacturing the piezoelectric element is proposed. In addition, in JP-A-2009-18551, a configuration of a piezoelectric element that suppresses generation of cracks by alleviating the tensile stress generated in the piezoelectric element during a driving process is proposed.

However, there is a problem in that the stress is concentrated in an area of the substrate outside an area in which the piezoelectric element is disposed, and cracks are generated between the end portion of the piezoelectric element and a support portion supporting the substrate.

SUMMARY

An advantage of some aspects of the invention is that it provides a piezoelectric actuator and a liquid ejecting head capable of suppressing generation of cracks. The invention can be implemented in the following forms or applications.

Application 1

According to an aspect of the invention, there is provided a piezoelectric actuator including: a substrate that is supported by a support portion; a piezoelectric element that includes a lower electrode formed on the substrate, a piezoelectric layer formed on the lower substrate, and an upper electrode formed on the piezoelectric layer; and a driving circuit that applies a voltage to the piezoelectric element. The upper electrode has a first upper electrode that is positioned on an outer peripheral side of the piezoelectric layer and at least one second upper electrode that is positioned on a center side of the piezoelectric layer, and a voltage applied to the first upper electrode is lower than a voltage applied to the second upper electrode.

According to the above-described configuration, the first upper electrode positioned on the outer peripheral side of the piezoelectric layer and at least one second upper electrode positioned on the center side of the piezoelectric layer are included. The voltage applied to the first upper electrode is lower than that applied to the second upper electrode. Thus, in the piezoelectric element, the electric field and the strain applied to the outer peripheral side are weaker than those applied to the center side. Accordingly, in the substrate configuring the pressure generating chamber, concentration of the stress in the area outside the area in which the piezoelectric element is disposed is suppressed. Therefore, generation of cracks between the end portion of the piezoelectric element and the support portion that supports the substrate can be suppressed.

Application 2

In this case, there is provided the above-described piezoelectric actuator further including: a first resistor that connects the lower electrode and the first upper electrode to each other; and a second resistor that connects the first upper electrode and the second upper electrode to each other.

According to the above-described configuration, the voltage applied to the first upper electrode can be set to be lower than that applied to the second upper electrode.

Application 3

In this case, there is provided the above-described piezoelectric actuator, wherein, when the voltage applied to the first upper electrode is V1, the voltage applied to the second upper electrode is V2, the first resistor has resistance of R1, and the second resistor has resistance of R2, the voltage V1 applied to the first upper electrode is calculated by using the following equation.

$$V1 = V2 \times R1/(R1+R2)$$

According to the above-described configuration, the voltage V1 applied to the first upper electrode is a voltage acquired by dividing the voltage V2 applied to the second upper electrode by the first resistor R1 and the second resistor R2. Accordingly, the voltage V1 applied to the outer peripheral side of the piezoelectric element can be set to be lower than the voltage V2 applied to the center side of the piezoelectric element.

Application 4

In this case, there is provided the above-described piezoelectric actuator, wherein a voltage applied to one of a plurality of the second upper electrodes decreases as the corresponding second upper electrode is disposed further toward an outer peripheral side.

According to the above-described configuration, a difference in voltages applied to two second upper electrodes that are adjacent to each other can be decreased. Accordingly, the amount of change in the strain generated from the center portion of the piezoelectric element toward the outer peripheral side thereof can be decreased. Therefore, concentration of the stress can be suppressed in the piezoelectric element.

Application 5

In this case, there is provided the above-described piezoelectric actuator, further including a vibration plate that is formed in a lower side of the lower electrode and is transformed by the piezoelectric element.

According to the above-described configuration, concentration of the stress in the area outside an area in which the piezoelectric element is brought into contact with the vibration plate is suppressed. Accordingly, the strain applied to the outer peripheral side is lower than that applied to the center side in the piezoelectric element. Therefore, concentration of the stress in the area outside the area in which the piezoelectric element is disposed is suppressed in the vibration plate configuring the pressure generating chamber, whereby generation of cracks between the end portion of the piezoelectric element and the support portion supporting the vibration plate can be suppressed.

Application 6

In this case, there is provided a liquid ejecting head including: any one of the above-described piezoelectric actuators; a pressure generating chamber that is formed in the substrate; and a nozzle plate that is formed in a lower side of the substrate and has a nozzle communicating with the pressure generating chamber.

According to the above-described configuration, generation of cracks between the end portion of the piezoelectric element and the support portion supporting the vibration plate can be suppressed.

BRIEF DESCRIPTION OF THE DRAWINGS

The invention will be described with reference to the accompanying drawings, wherein like numbers reference like elements.

FIG. 3 is an external perspective view of a piezoelectric element including upper electrode films and lead electrodes.

DESCRIPTION OF EXEMPLARY EMBODIMENTS

Hereinafter, embodiments of the invention will be described with reference to the accompanying drawings.

First Embodiment

Figure 1:
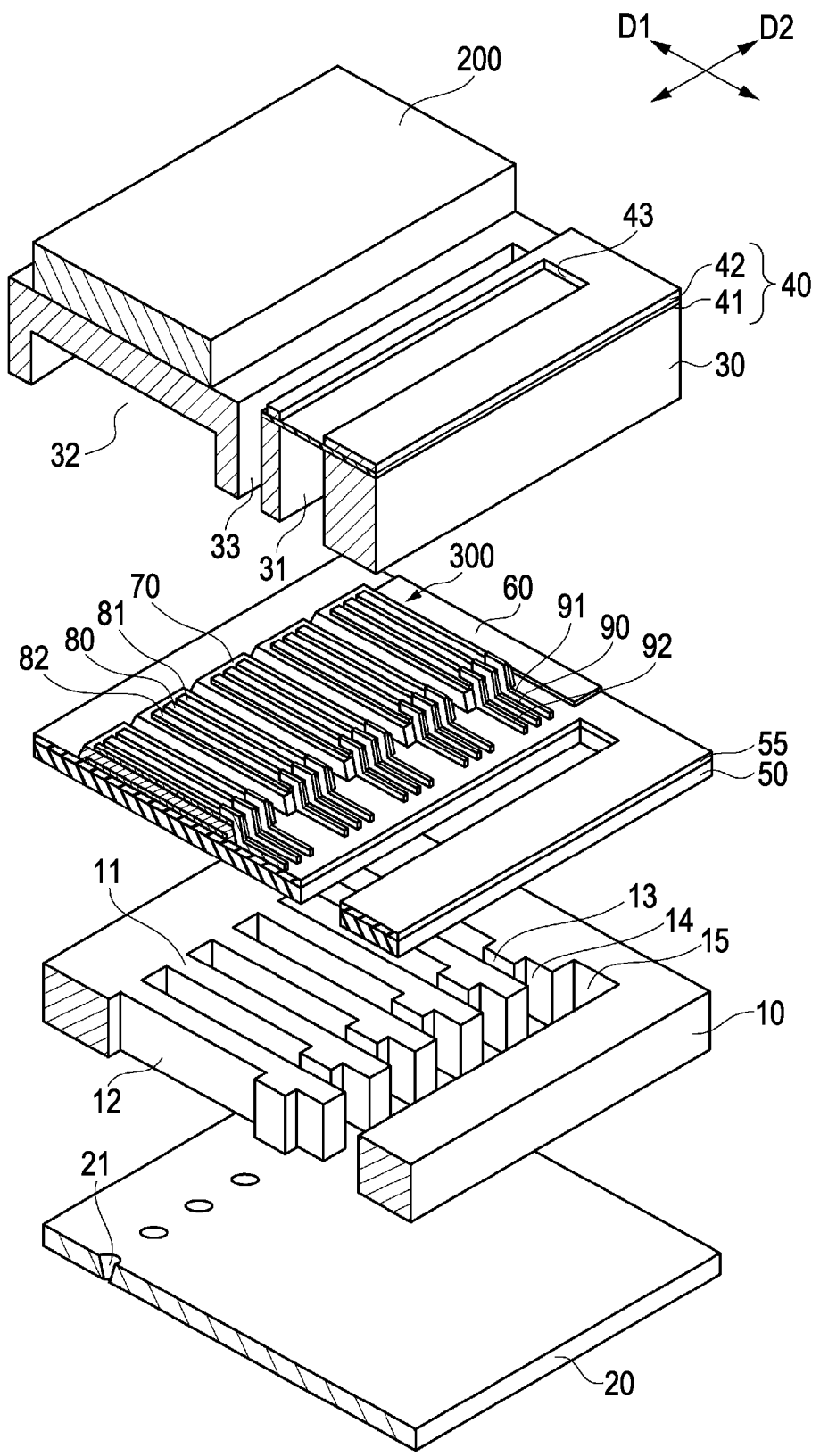
FIG. 1 is an exploded perspective view schematically showing the configuration of an ink jet recording head as an example of a liquid ejecting head.
Figure 2A:
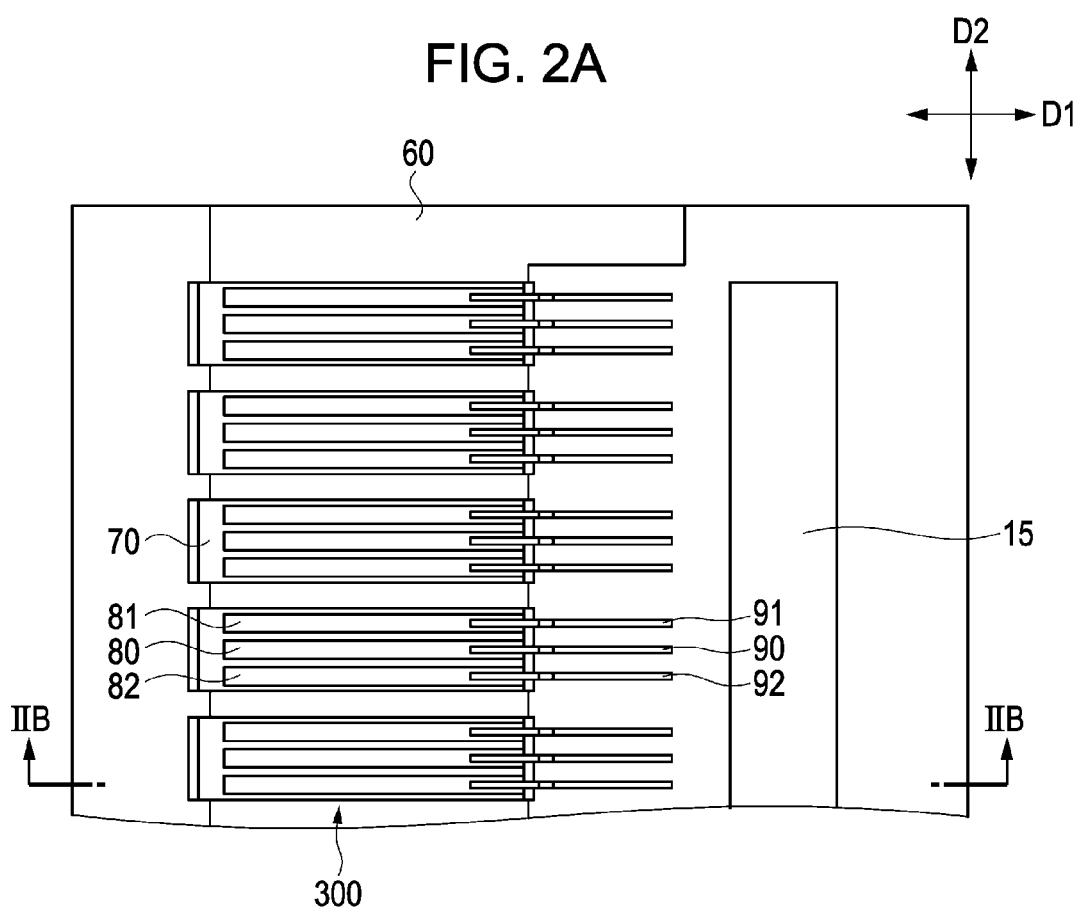
FIG. 2A is a plan view of the ink jet recording head.
Figure 2B:
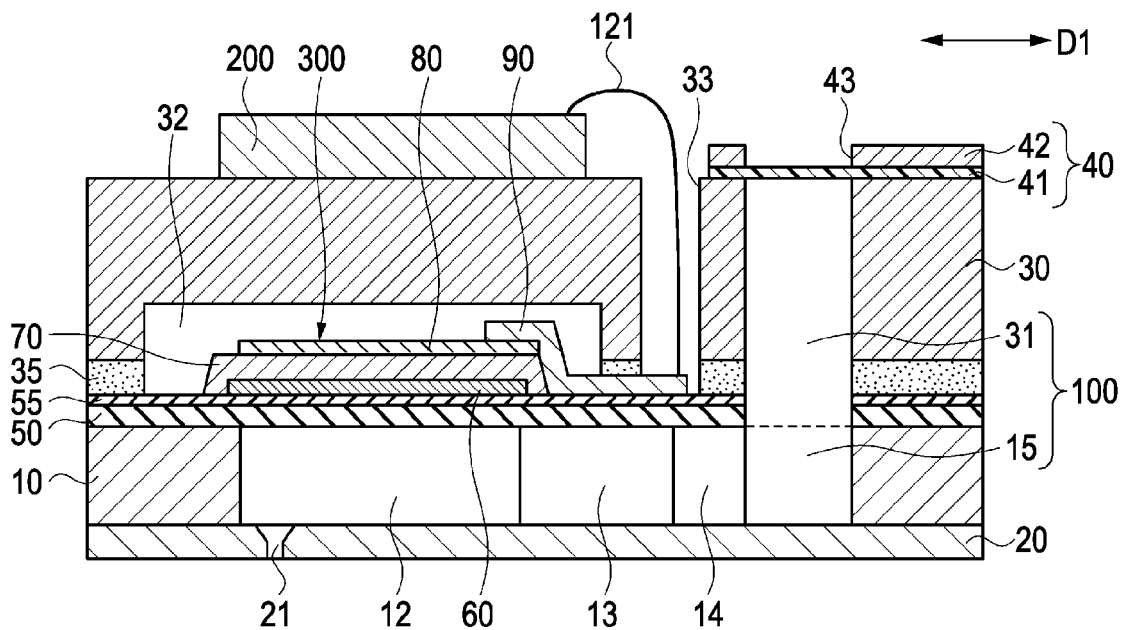
FIG. 2B is a cross-sectional view of the ink jet recording head.

FIG. 1 is an exploded perspective view schematically showing the schematic configuration of an ink jet recording head as an example of a liquid ejecting head according to a first embodiment of the invention. FIG. 2A is a plan view of FIG. 1, viewed from the upper side in FIG. 1, with a protection substrate 30, which has a driving circuit 200, removed from the ink jet recording head shown in FIG. 1. FIG. 2B is a cross-sectional view of FIG. 2A taken along line IIB-IIB.

As shown in FIG. 1, a flow path forming substrate 10 according to this embodiment is formed from a silicon monocrystal substrate with a crystal plane orientation of the (110) plane. On one face of the flow path forming substrate 10, an elastic film 50 is formed which is formed in advance from silicon dioxide by thermal oxidation.

In the flow path forming substrate 10, pressure generating chambers 12 that are partitioned using a plurality of partition walls 11 are arranged in the width direction D2 (short side direction) of the pressure generating chamber 12 by performing anisotropic etching from the other surface side. In addition, on one end portion side of the flow path forming substrate 10 in the longitudinal direction D1 of the pressure generating chamber 12, ink supply paths 13 and communication paths 14 are partitioned by the partition walls 11.

At one end of the communication paths 14, a communication portion 15 is formed that configures a part of a reservoir 100 that becomes a common ink chamber (liquid chamber) of the respective pressure generating chambers 12. In other words, in the flow path forming substrate 10, liquid flow paths are disposed that are formed of the pressure generating chambers 12, the ink supply paths 13, the communication paths 14, and the communication portion 15.

The ink supply path 13 communicates with one end portion side of the pressure generating chamber 12 in the longitudinal direction and has a cross-sectional area that is smaller than that of the pressure generating chamber 12. For example, according to this embodiment, the ink supply path 13 is formed to have a width smaller than that of the pressure generating chamber 12 by narrowing the flow path on the pressure generating chamber 12 side between the reservoir 100 and the respective pressure generating chamber 12 in the width direction. Accordingly, the flow path resistance of ink flowing into the pressure generating chamber 12 from the communication flow path 14 is maintained to be constant. In addition, as described above, according to this embodiment, the ink supply path 13 is formed by narrowing the width of the flow path from one side. However, the ink supply path may be formed by narrowing the width of the flow path from both sides thereof.

Alternatively, the ink supply path may be formed not by narrowing the width of the flow path but by narrowing the flow path in the thickness direction. In addition, each communication path 14 communicates with the side of the ink supply path 13 that is located opposite to the pressure generating chamber 12 and has a cross-sectional area that is larger than that of the ink supply path 13 in the width direction D2 (short side direction). In this embodiment, the communication path 14 is formed so as to have a cross-sectional area that is the same as that of the pressure generating chamber 12.

In other words, in the flow path forming substrate 10, the pressure generating chambers 12, the ink supply paths 13, that have a cross-sectional area smaller than that of the pressure generating chamber 12 in the short side direction, and the communication paths 14, that communicate with the ink supply paths 13 and each has a cross-sectional area larger than that of the ink supply path 13 in the width direction D2, are arranged so as to be partitioned by the plurality of partition walls 11.

In addition, on the opening face side of the flow path forming substrate 10, a nozzle plate 20, in which nozzle openings 21 are formed that each communicates with an area near the end portion of one of the pressure generating chambers 12 on the side opposite to the ink supply path 13, is fixed with an adhesive agent, a thermal welding film or the like. The nozzle plate 20 is formed, for example, of a glass ceramic, a silicon monocrystal substrate, stainless steel or the like.

On the other hand, on the side of the flow path forming substrate 10 that is located opposite to the opening face, the elastic film 50 made from silicon dioxide is formed as described above. An insulating film 55, which is formed in a laminated manner from zirconium oxide ($ZrO_2$) or the like, is formed on the elastic film 50.

In addition, on the insulating film 55, a lower electrode film 60, for example, formed from platinum (Pt), iridium (Ir), or the like, a piezoelectric layer 70 formed from lead zirconium titanate (PZT) as an example of a piezoelectric material or the like, upper electrode films 81 and 82 as first upper electrodes that are, for example, formed from platinum (Pt), iridium (Ir), or the like, and an upper electrode film 80 as a second upper electrode are formed in a laminated manner, whereby they configure a piezoelectric element 300. Here, the piezoelectric element 300 is the portion that includes the lower electrode film 60, the piezoelectric layer 70, and the upper electrode films 80, 81, and 82.

Generally, any one side of the upper electrode films 80, 81, and 82 and the lower electrode film 60 is configured as a common electrode, and the other side of the electrode films and the piezoelectric layer 70 are configured by being patterned for each pressure generating chamber 12. In this embodiment, as shown in FIGS. 1 and 2A, by disposing the lower electrode film 60 so as to extend in an area facing the plurality of pressure generating chambers 12, the lower electrode film 60 is configured as the common electrode of the plurality of piezoelectric elements 300. In addition, by separating the upper electrode films 80, 81, and 82 and the piezoelectric layer 70 for each piezoelectric element 300, the upper electrode films 80, 81, and 82 are configured as individual electrodes of the respective piezoelectric elements 300.

In addition, lead electrodes 90, 91, and 92 that are drawn out from near the end portion located on the ink supply path 13 side and extend to the insulating film 55, and, for example, are formed from gold (Au) or the like are each connected to the respective upper electrode films 80, 81, and 82 that are individual electrodes of the piezoelectric elements 300.

On the flow path forming substrate 10 on which the above-described piezoelectric elements 300 are formed, that is, on the lower electrode film 60, the elastic film 50, and the lead electrodes 90, 91, and 92, a protection substrate 30, which has a reservoir portion 31 that constitutes at least a part of the reservoir 100, is bonded through an adhesive agent 35. This reservoir portion 31, in this embodiment, is formed so as to perforate the protection substrate 30 in the thickness direction and extend in the width direction D2 of the pressure generating chamber 12 and communicates with the communication portion 15 of the flow path forming substrate 10, as described above, so as to configure the reservoir 100 to become a common ink chamber for the pressure generating chambers 12.

Alternatively, the communication portion 15 of the flow path forming substrate 10 may be divided into a plurality of portions for the pressure generating chambers 12, so that only the reservoir portion 31 is configured as a reservoir. Furthermore, for example, it may be configured that only the pressure generating chamber 12 is disposed on the flow path forming substrate 10, and the ink supply path 13 that allows the reservoir and the pressure generating chambers 12 to communicate each other is disposed in a member (for example, the elastic film 50, the insulating film 55, or the like) interposed between the flow path forming substrate 10 and the protection substrate 30.

In addition, in an area of the protection substrate 30 that faces the piezoelectric elements 300, a piezoelectric element holding portion 32 is formed with a space that does not block the movement of the piezoelectric elements 300. As long as the piezoelectric element holding portion 32 has a space that does not block the movement of the piezoelectric elements 300, the space may be or may not be sealed.

It is preferable that a material, such as glass, a ceramic material or the like that has a same rate of thermal expansion as that of the flow path forming substrate 10, is used for the above-described protection substrate 30. In this embodiment, the protection substrate 30 is formed by using a silicon monocrystal substrate that is formed from the same material as that of the flow path forming substrate 10.

In addition, a through hole 33 that passes through the protection substrate 30 in the thickness direction is formed in the protection substrate 30. In addition, a portion of each lead electrode 90 near the end portion thereof that is extracted from each piezoelectric element 300 is disposed so as to be exposed to the inside of the through hole 33.

In addition, a driving circuit 200, which is used for driving the piezoelectric elements 300 arranged so as to be parallel to one another, is fixed on the protection substrate 30. As the driving circuit 200, for example, a circuit substrate, a semiconductor integrated circuit (IC), or the like may be used. In addition, the driving circuit 200 and the lead electrodes 90, 91, and 92 are electrically connected to each other through a connection wire 121 that is formed of a conductive wire such as a bonding wire.

In addition, a compliance substrate 40 that is formed of a sealing film 41 and a fixing plate 42 is bonded on the protection substrate 30. Here, the sealing film 41 is formed of a flexible material with low rigidity (for example, a poly phenylene sulfide (PPS) film with a thickness of 6 μm), and one-side face of the reservoir portion 31 is sealed by the sealing film 41. The fixing plate 42 is formed of a hard material (for example, stainless steel (SUS) or the like with a thickness of 30 μm) such as a metal. An area of the fixing plate 42 that faces the reservoir 100 is an opening portion 43 that is completely removed in the thickness direction. Accordingly, one-side face of the reservoir 100 is sealed only by the sealing film 41 which is flexible.

According to the ink jet recording head of this embodiment, the inside is filled with ink from the reservoir 100 up to the nozzle opening 21 by inserting ink from an ink introducing opening that is connected to an external ink supplying unit that is not shown in the figure, and then, a voltage is applied between the lower electrode film 60 and the upper electrode films 80, 81, and 82 corresponding to each pressure generating chamber 12 in accordance with a recording signal transmitted from the driving circuit 200, whereby the elastic film 50, the insulating film 55, the lower electrode film 60, and the piezoelectric layer 70 are transformed so as to be bent. Accordingly, the pressure inside each pressure generating chamber 12 is increased, whereby ink droplets are ejected from the nozzle opening 21.

The piezoelectric actuator is configured to include the piezoelectric element 300 that has the upper electrode films 80, 81, and 82 and the lead electrodes 90, 91, and 92, the insulating film 55 and the elastic film 50 as substrates in which the piezoelectric element 300 is disposed, and a driving circuit 200 that drives the piezoelectric element 300.

Here, the piezoelectric element 300, the driving circuit 200, and a vibration plate that is displaced in accordance with driving of the piezoelectric element 300 are collectively referred to as a piezoelectric actuator. In the above-described example, the elastic film 50, the insulating film 55, and the lower electrode film 60 act as the vibration plate. However, only the lower electrode film 60 may remain without disposing the elastic film 50 and the insulating film 55 so as to configure the lower electrode film 60 as the vibration plate.

FIG. 3 is an external perspective view of one piezoelectric element 300 including the upper electrode films 80, 81, and 82 and the lead electrodes 90, 91, and 92. The lower electrode film 60 may be included as a common electrode of the piezoelectric element 300.

The upper electrode films 80, 81, and 82 that are individual electrodes of the piezoelectric element 300 are arranged in the piezoelectric layer 70 in the width direction D2 with the longitudinal direction thereof being as D1. The upper electrode films 81 and 82 as the first upper electrodes are arranged on the outer peripheral side of the piezoelectric element 300 in the width direction D2. The upper electrode film 80 as the second upper electrode is arranged in the center portion of the piezoelectric element 300 in the width direction D2. In other words, the upper electrode film 80 is arranged in a position interposed between the upper electrode films 81 and 82. The lead electrodes 90, 91, and 92 are connected to the upper electrode films 80, 81, and 82.

Figure 4:
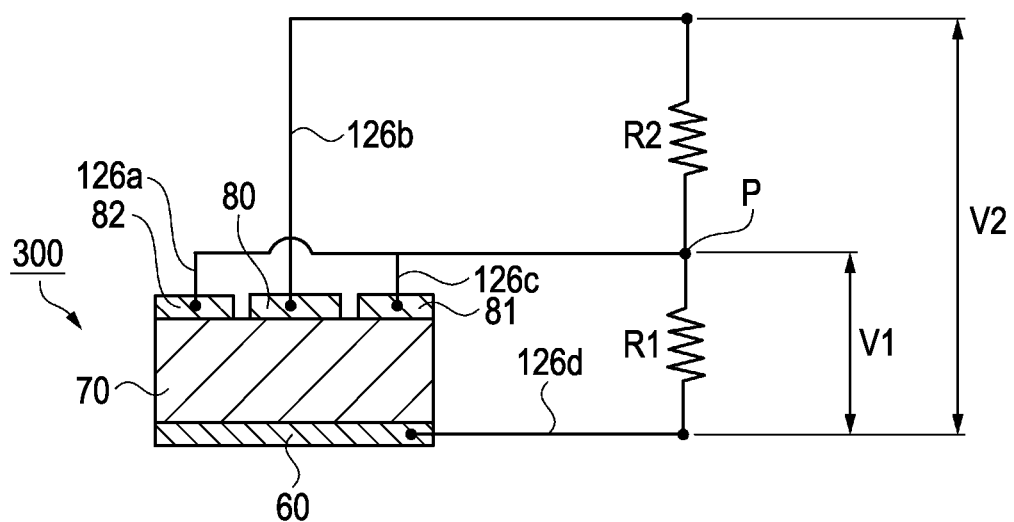
FIG. 4 is a circuit diagram, which includes a first resistor and a second resistor, for representing voltages applied to a first upper electrode and a second upper electrode.

FIG. 4 is a circuit diagram, which includes a first resistor R1 and a second resistor R2, for representing voltages applied to the first upper electrode and the second upper electrode. The first resistor R1 is connected to the upper electrode films 81 and 82 as the first upper electrodes through connection wires 126a and 126c. In addition, the first resistor R1 is connected to the lower electrode film 60 through a connection wire 126d. The second resistor R2 is connected to the upper electrode films 81 and 82 as the first upper electrodes through connection wires 126a and 126c. In addition, the second resistor R2 is connected to the upper electrode film 80 as the second upper electrode through a connection wire 126b.

When the voltage of the lower electrode film 60 is used as a reference voltage, a voltage applied to the upper electrode films 81 and 82 as the first upper electrodes is denoted by V1, and a voltage applied to the upper electrode film 80 as the second upper electrode is denoted by V2, the voltage V1 is calculated by using the following Equation (1).

$$V1 = V2 \times R1/(R1+R2) \qquad (1)$$

As represented by Equation (1), the voltage V1 is acquired by dividing the voltage V2 at a center position P of the first resistor R1 and the second resistor R2 that are aligned in series. Accordingly, the voltage V1 applied to the upper electrode films 81 and 82 as the first upper electrodes can be set to be lower than the voltage V2 applied to the upper electrode film 80 as the second upper electrode.

Figure 5:
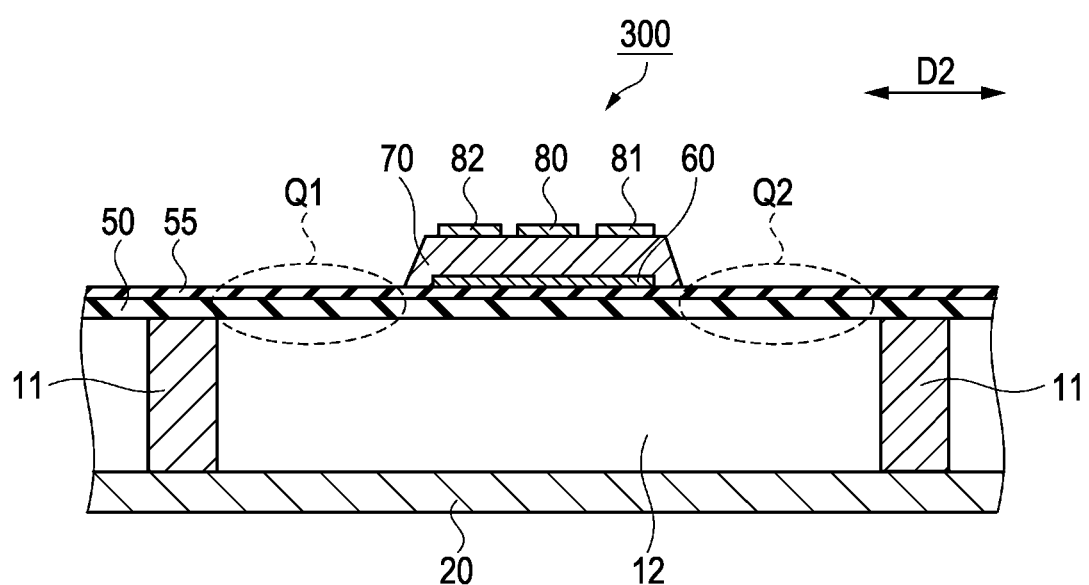
FIG. 5 is a partial cross-sectional view showing an elastic film and an insulating film as the substrates supported by partition walls of a flow path forming substrate.

FIG. 5 is a partial cross-sectional view showing the elastic film 50 and the insulating film 55 as the substrates supported by the partition walls 11 as a support portion of the flow path forming substrate 10. FIG. 5 is a cross-sectional view viewed in the longitudinal direction D1 shown in FIG. 1. As described above, in the piezoelectric layer 70, the voltage V1 applied to the upper electrode films 81 and 82 disposed on the outer peripheral side in the width direction D2 is lower than the voltage V2 applied to the upper electrode film 80 disposed on the center side in the width direction D2.

Accordingly, in the piezoelectric layer 70, the electric field and the strain on the outer peripheral side in the width direction D2 is lower than those on the center side in the width direction D2. Accordingly, concentration of the stress in areas Q1 and Q2 of the insulating film 55 and the elastic film 50 as substrates in which the piezoelectric element 300 is not disposed, that is, between the end portion of the piezoelectric element 300 and the partition wall 11 as the support portion in the width direction D2 is suppressed. Therefore, generation of cracks can be suppressed.

The first resistor R1 and the second resistor R2 may be arranged inside the driving circuit 200 shown in FIG. 1. Alternatively, the first and second resistors R1 and R2 may be connected to the connection wire 121 shown in FIG. 2B or the lead electrodes 90, 91, and 92 shown in FIG. 3.

In this embodiment, the first resistor R1 and the second resistor R2 are arranged. However, a resistor included in the upper electrode film by changing the width of the upper electrode film so as to change the conductive cross-section area of the upper electrode film may be used.

As described above, the piezoelectric actuator described in this embodiment includes: the insulating film 55 and the elastic film 50 as substrates supported by the partition walls 11 as support portions; the piezoelectric element 300 that includes the lower electrode film 60 as the lower electrode formed on the substrate, the piezoelectric layer 70 formed on the lower electrode film 60, and the upper electrode films 80, 81, and 82 as the upper electrodes formed on the piezoelectric layer 70; and the driving circuit 200 that applies a voltage to the piezoelectric element 300. In addition, the upper electrode films 80, 81, and 82 include the upper electrode films 81 and 82 as the first upper electrodes positioned on the outer peripheral side of the piezoelectric layer 70 and the upper electrode film 80 as the second upper electrode positioned on the center side of the piezoelectric layer 70, and the voltage applied to the upper electrode films 81 and 82 is lower than that applied to the upper electrode film 80.

According to such a configuration, in the piezoelectric element 300, the electric field and the strain that are applied to the outer peripheral side are lower than those applied to the center side. Accordingly, in the insulating film 55 and the elastic film 50 as substrates configuring the pressure generating chamber 12, concentration of the stress in the areas Q1 and Q2 (see FIG. 5) that are positioned on the outer sides of the area in which the piezoelectric element 300 is arranged and are between the end portion of the piezoelectric element 300 and the partition wall 11 as the support portion supporting the substrate is suppressed. Therefore, generation of cracks in the areas Q1 and Q2 can be suppressed.

Second Embodiment

In a second embodiment of the invention, a piezoelectric actuator in which a first upper electrode surrounding a second upper electrode disposed on the center side will be described.

Figure 6A:
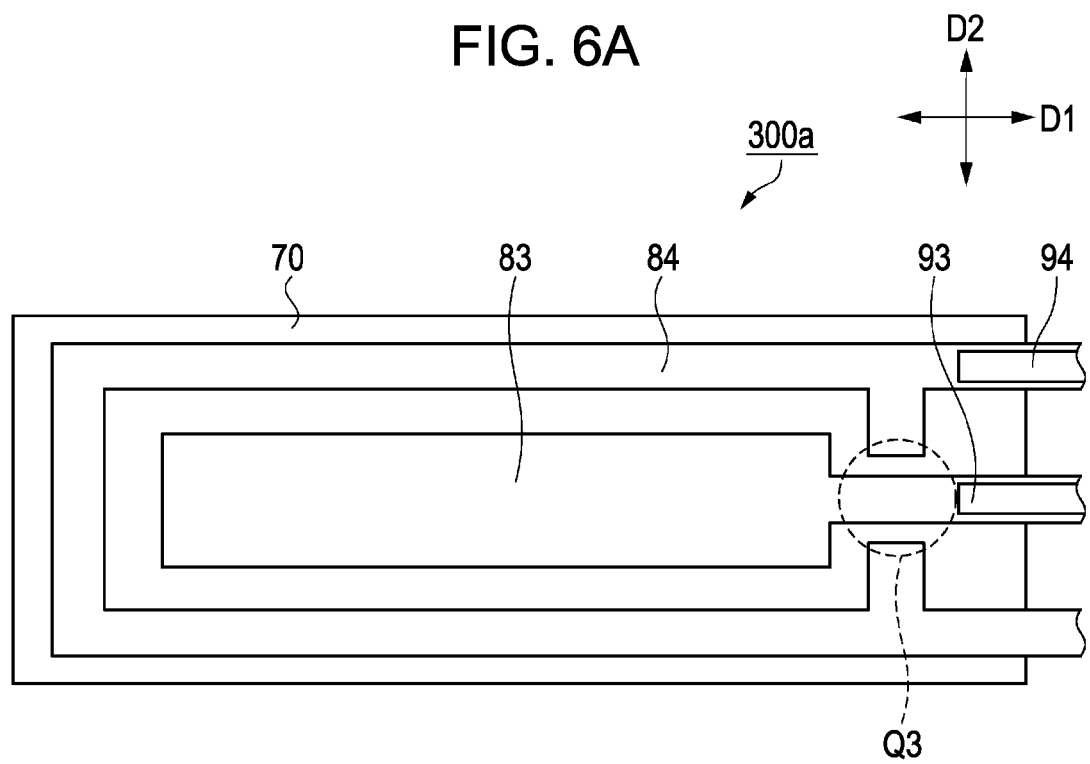
FIGS. 6A and 6B are diagrams representing an upper electrode film as a first upper electrode is disposed so as to surround an upper electrode film as a second upper electrode.

FIG. 6A is a diagram representing that an upper electrode film 84 as the first upper electrode is disposed so as to surround an upper electrode film 83 as the second upper electrode. The upper electrode film 83 is disposed on the center portion of the piezoelectric layer 70. The upper electrode film 84 is disposed so as to surround the upper electrode film 83.

To the upper electrode films 83 and 84, lead electrodes 93 and 94 are connected. In order not to allow the upper electrode films 83 and 84 to intersect with each other, the upper electrode film 84 is not formed in the area Q3.

Figure 6B:
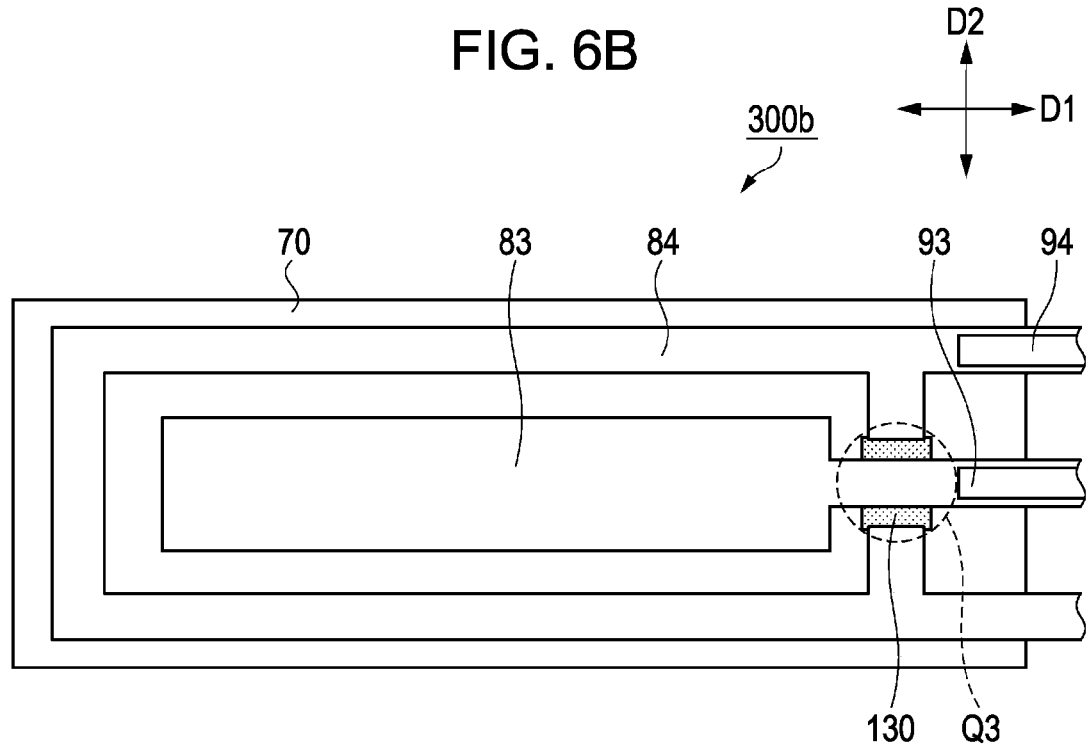

FIG. 6B is a diagram showing that the upper electrode 84 as the first upper electrode is disposed so as to surround the upper electrode film 83 as the second upper electrode and the upper electrode films 83 and 84 intersect with each other also in the area Q3. In the area Q3 of the piezoelectric layer 70 of the piezoelectric element 300b shown in FIG. 6B, an insulating layer 130 is formed between the upper electrode films 83 and 84, whereby the upper electrode films 83 and 84 are not in the conductive state.

As described above, the upper electrode film 84 is disposed so as to surround the upper electrode film 83. Accordingly, a voltage applied to the upper electrode film 84 as the first upper electrode disposed on the outer peripheral side in the longitudinal direction D1 and the width direction D2 is lower than a voltage applied to the upper electrode film 83 as the second upper electrode disposed on the center side. Therefore, in the piezoelectric element 300a shown in FIG. 6A and the piezoelectric element 300b shown in FIG. 6B, the strain applied to the outer peripheral side in the longitudinal direction D1 and the width direction D2 is lower than that applied to the center side.

Accordingly, in the insulating film 55 and the elastic film 50 as substrates configuring the pressure generating chamber 12, concentration of the stress in the areas Q1 and Q2 (see FIG. 5) that are positioned on the outer sides of the area in which the piezoelectric elements 300a and 300b are arranged and are between the end portion of the piezoelectric elements 300a and 300b and the partition wall 11 as the support portion supporting the substrate is suppressed. Therefore, generation of cracks in the areas Q1 and Q2 can be suppressed.

The other configurations of the piezoelectric actuator according to the second embodiment are the same as those described in the first embodiment.

Third Embodiment

In a third embodiment of the invention, a piezoelectric actuator in which a plurality of second upper electrodes is included in a piezoelectric layer 70 will be described.

Figure 7A:
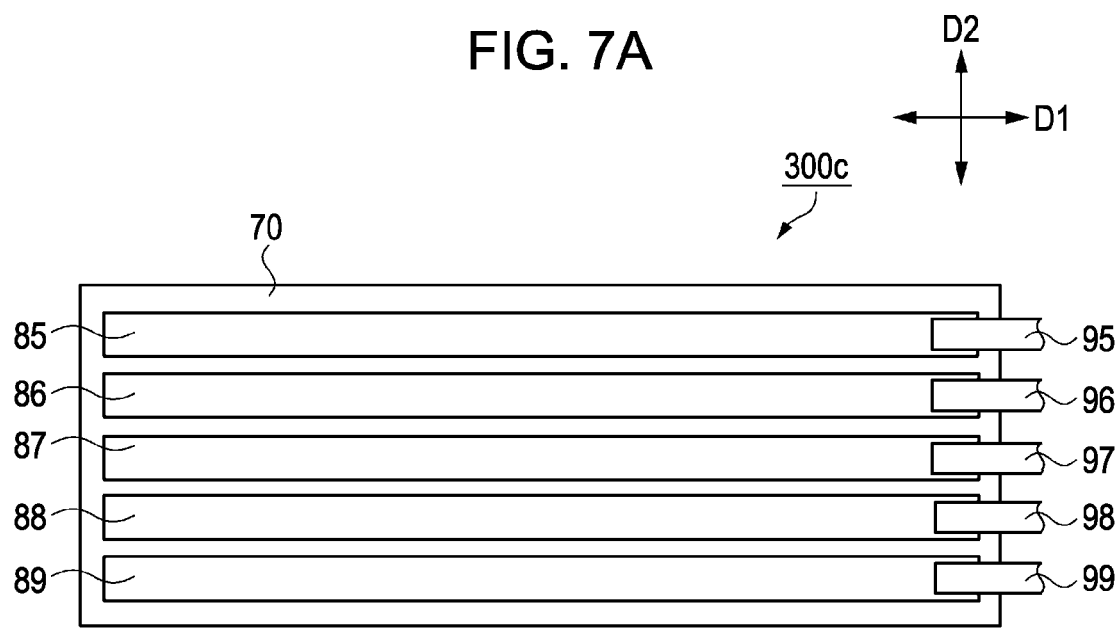
FIG. 7A is a diagram showing upper electrode films as a plurality of second upper electrodes are arranged in the width direction.

FIG. 7A is a diagram showing that upper electrode films 85 and 89 as first upper electrodes having their longitudinal direction as D1 are arranged on the outer peripheral sides of the piezoelectric layer 70 in the width direction D2. In addition, upper electrode films 86, 87, and 88 as second upper electrodes having their longitudinal direction as D1 and are disposed on the center portion of the piezoelectric layer 70 in the width direction D2.

To the upper electrode films 85 to 89, lead electrodes 95 to 99 used for applying voltages to respective upper electrode films are respectively connected.

The voltage applied to the upper electrode film 87 that is disposed on the center line in the width direction D2 has a maximum voltage of all the voltages of the upper electrode films 85 to 89. Accordingly, the voltage applied to the upper electrode films 86 and 88 adjacent to the outer peripheral side of the upper electrode film 87 disposed on the center line in the width direction D2 is lower than that applied to the upper electrode film 87. In other words, the voltage applied to one of the upper electrode films 86 to 88 as the second upper electrodes decreases as the corresponding second upper electrode is disposed further toward the outer peripheral side in the width direction D2.

In addition, a voltage applied to the upper electrode film 85 that is adjacent to the outer peripheral side of the upper electrode film 86 in the width direction D2 is lower than that applied to the upper electrode film 86. Similarly, a voltage applied to the upper electrode film 89 that is adjacent to the outer peripheral side of the upper electrode film 88 in the width direction D2 is lower than that applied to the upper electrode film 88.

Under this configuration, a difference in voltages applied to two second upper electrodes that are adjacent to each other in the width direction D2 can be decreased. Accordingly, in the piezoelectric layer 70 of the piezoelectric element 300c, the amount of change in the strain generated from the center portion toward the outer peripheral side can be decreased. Therefore, concentration of stress in the piezoelectric layer 70 of the piezoelectric element 300c can be suppressed.

Figure 7B:
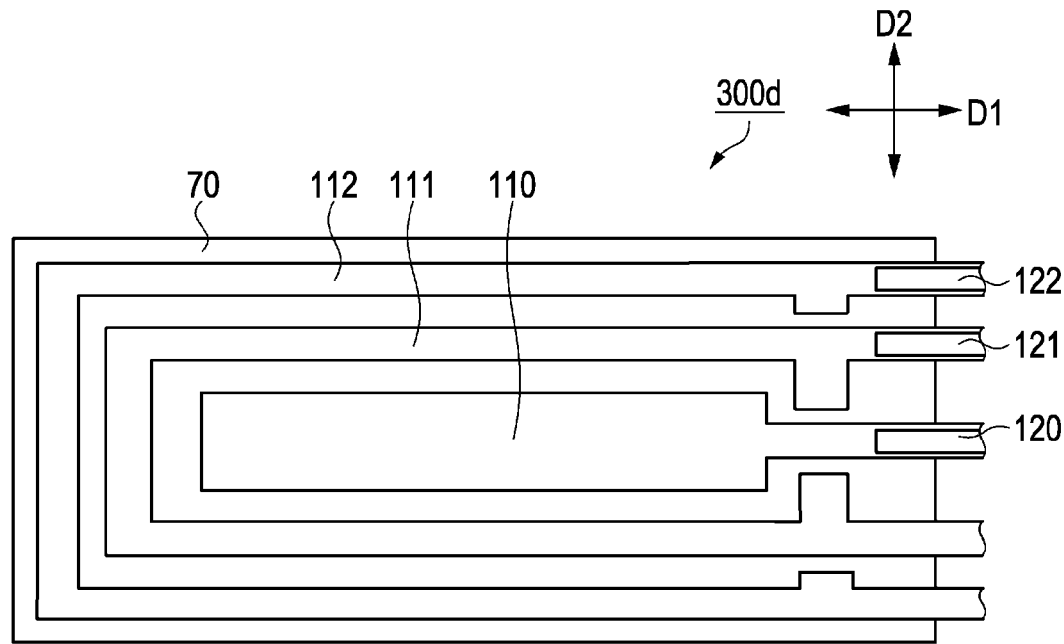
FIG. 7B is a diagram showing a piezoelectric actuator in which a first upper electrode is disposed so as to surround a plurality of second upper electrodes.

FIG. 7B is a diagram showing a piezoelectric actuator in which a first upper electrode is disposed so as to surround a plurality of second upper electrodes. An upper electrode film 111 as the second upper electrode is disposed so as to surround an upper electrode film 110 as the second upper electrode disposed on the center portion of the piezoelectric layer 70. In addition, an upper electrode film 112 as the first upper electrode is disposed so as to surround the upper electrode film 111 as the second upper electrode. To the upper electrode films 110, 111, and 112, lead electrodes 120, 121, and 122 are respectively connected.

Accordingly, differences in voltages applied to two second upper electrodes that are adjacent to each other in the width direction D2 and the longitudinal direction D1 can be decreased. Accordingly, in the piezoelectric layer 70 of the piezoelectric element 300d, the amount of change in the strain generated from the center portion toward the outer peripheral side can be decreased. Therefore, concentration of stress in the piezoelectric layer 70 of the piezoelectric element 300d can be suppressed.

Figure 8:
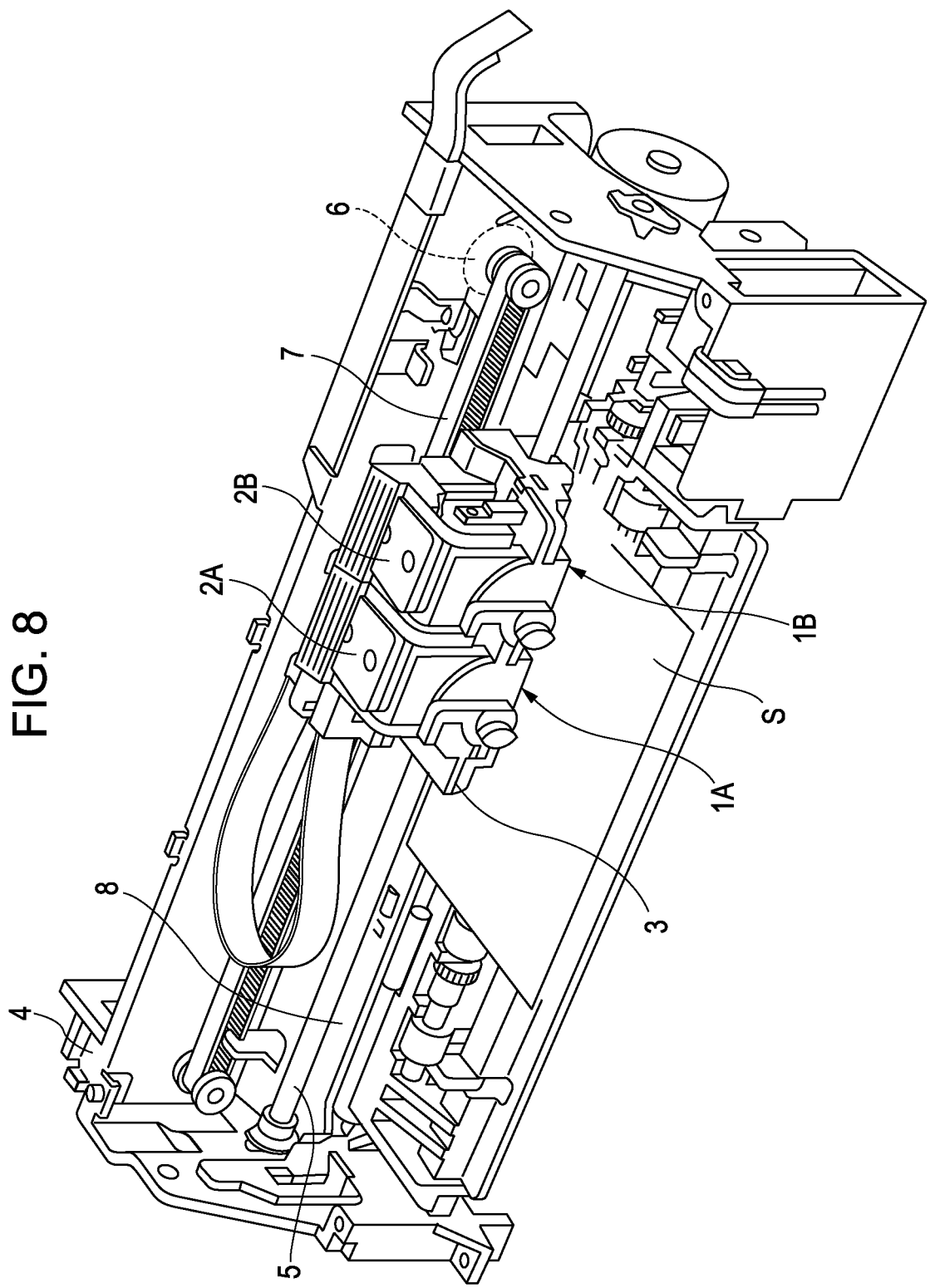
FIG. 8 is a schematic diagram showing an example of an ink jet recording apparatus.

An ink jet recording head that includes the piezoelectric actuator as described in the first to third embodiments configures a part of a recording head unit that includes an ink flow path that communicates with an ink cartridge or the like and is built in an ink jet recording apparatus. FIG. 8 is a schematic diagram showing an example of the ink jet recording apparatus.

As shown in FIG. 8, to recording head units 1A and 1B that have ink jet recording heads, cartridges 2A and 2B that configure an ink supplying unit are detachably attached. A carriage 3 in which the recording head units 1A and 1B are mounted is disposed in a carriage shaft 5 that is installed to a device main body 4 so as to be movable in the shaft direction. For example, the recording head units 1A and 1B are configured so as to eject a black ink composition, and a color ink composition.

Then, as the driving force of a driving motor 6 is transferred to the carriage 3 through a plurality of gears, not shown in the figure, and a timing belt 7, the carriage 3 in which the recording head units 1A and 1B are mounted moves along the carriage shaft 5. On the other hand, a platen 8 is disposed in the device main body 4 along the carriage 3. The platen 8 is configured to rotate depending on the driving force of a feed motor not shown in the figure. Accordingly, a recording sheets S that is a recording medium such as a paper sheet fed by a feed roller or the like can be transported so as to be wound around the platen 8.

In addition, in the first to third embodiments, the ink jet recording head has been described as an example of a liquid ejecting head. However, the invention is targeted for a general liquid ejecting head in a broad meaning. Thus, it is apparent that the invention can be applied to a liquid ejecting head that ejects liquid other than ink. As other liquid ejecting heads, for example, there are various recording heads used in an image recording apparatus such as a printer, a color material ejecting head that is used for manufacturing a color filter such as a liquid crystal display, an electrode material ejecting head that is used for forming an electrode of an organic EL display, an FED (field emission display), or the like, and a bio organic material ejecting head that is used for manufacturing a bio chip, and the like.

What is claimed is:

1. A piezoelectric actuator comprising:
   a substrate that is supported by a support portion;
   a piezoelectric element that includes a lower electrode formed on the substrate, a piezoelectric layer formed on the lower electrode, and an upper electrode formed on the piezoelectric layer; and
   a driving circuit that applies a voltage to the piezoelectric element,
   wherein the upper electrode has a first upper electrode that is positioned on an outer peripheral side of the piezoelectric layer and at least one second upper electrode that is positioned on a center side of the piezoelectric layer, wherein the first and second upper electrodes are both located above a pressure generating chamber that is formed in the substrate, and
   wherein a voltage applied to the first upper electrode is lower than a voltage applied to the second upper electrode.

2. The piezoelectric actuator according to claim 1, further comprising:
   a first resistor that connects the lower electrode and the first upper electrode to each other; and
   a second resistor that connects the first upper electrode and the second upper electrode to each other.

3. The piezoelectric actuator according to claim 1, wherein a voltage applied to one of a plurality of the second upper electrodes decreases as the corresponding second upper electrode is disposed further toward an outer peripheral side.

4. The piezoelectric actuator according to claim 1, further comprising a vibration plate that is formed in a lower side of the lower electrode and is transformed by the piezoelectric element.

5. A liquid ejecting head comprising:
   the piezoelectric actuator according to claims 1; and
   a nozzle plate that is formed in a lower side of the substrate and has a nozzle communicating with the pressure generating chamber.

6. The piezoelectric actuator according to claim 2, wherein, when the voltage applied to the first upper electrode is V1, the voltage applied to the second upper electrode is V2, the first resistor has resistance of R1, and the second resistor has resistance of R2, the voltage V1 applied to the first upper electrode is calculated by using the following equation $$V1 = V2 \times R1/(R1+R2).$$

* * * * *